(12) United States Patent
Choi et al.

(10) Patent No.: US 11,393,975 B2
(45) Date of Patent: Jul. 19, 2022

(54) METHOD AND APPARATUS FOR GENERATING SKYRMION LATTICE STABILIZED AT HIGH TEMPERATURE

(71) Applicant: KOREA INSTITUTE OF SCIENCE AND TECHNOLOGY, Seoul (KR)

(72) Inventors: Jun Woo Choi, Seoul (KR); Hee Young Kwon, Seoul (KR); Byoung Chul Min, Seoul (KR); Suk Hee Han, Seoul (KR); Hye Jung Chang, Seoul (KR)

(73) Assignee: Korea Institute of Science and Technology

( * ) Notice: Subject to any disclaimer, the term of this patent is extended or adjusted under 35 U.S.C. 154(b) by 42 days.

(21) Appl. No.: 17/100,155

(22) Filed: Nov. 20, 2020

(65) Prior Publication Data

US 2022/0020921 A1    Jan. 20, 2022

(30) Foreign Application Priority Data

Jul. 15, 2020  (KR) .......................... 10-2020-0087259

(51) Int. Cl.
*G11C 11/08*      (2006.01)
*H01L 43/12*      (2006.01)
*H01L 43/02*      (2006.01)
*H01L 43/08*      (2006.01)
*H01L 43/10*      (2006.01)
*B82Y 25/00*      (2011.01)

(52) U.S. Cl.
CPC .............. *H01L 43/12* (2013.01); *H01L 43/02* (2013.01); *H01L 43/08* (2013.01); *H01L 43/10* (2013.01); *B82Y 25/00* (2013.01)

(58) Field of Classification Search
CPC ......... H01L 43/12; H01L 43/02; H01L 43/08; H01L 43/10
See application file for complete search history.

(56) References Cited

U.S. PATENT DOCUMENTS

| | | | |
|---|---|---|---|
| 10,339,993 B1 * | 7/2019 | Schabes | H01L 43/12 |
| 10,720,572 B1 * | 7/2020 | Fitelson | H01L 43/10 |
| 2017/0018297 A1 * | 1/2017 | Zang | G11C 11/161 |
| 2020/0006628 A1 * | 1/2020 | O'Brien | H01F 10/3286 |

* cited by examiner

*Primary Examiner* — Pho M Luu
(74) *Attorney, Agent, or Firm* — Mendelsohn Dunleavy, P.C.

(57) ABSTRACT

Provided is a method of a generating a skyrmion. The method includes a step of preparing a magnetic multilayer system and a step of generating a skyrmion at a temperature of 400° C. or higher by adjusting the magnetic anisotropy value and the magnetization value of the magnetic multilayer system.

14 Claims, 8 Drawing Sheets

ACS Appl. Mater. Interfaces 2018

METHOD AND APPARATUS FOR GENERATING SKYRMION LATTICE STABILIZED AT HIGH TEMPERATURE

STATEMENT OF GOVERNMENTAL SUPPORT

This invention was made with government support under Project No. CAP-16-01-KIST awarded by Creative Allied Project (CAP) through the National Research Council of Science & Technology (NST) funded by the Ministry of Science and ICT. The government support was made at a contribution rate of 80/100 for the research period of Jul. 1, 2019 through Jun. 30, 2020. The supervising institute was KOREA INSTITUTE OF SCIENCE AND TECHNOLOGY.

This invention was additionally made with government support under Project No. 2E30600 awarded by the KIST Institutional Program funded by the Ministry of Science and ICT. The government support was made at a contribution rate of 20/100 for the research period of Jan. 1, 2020 through Dec. 31, 2020. The supervising institute was KOREA INSTITUTE OF SCIENCE AND TECHNOLOGY.

CROSS REFERENCE TO RELATED APPLICATION

The present application claims priority to Korean Patent Application No. 10-2020-0087259, filed Jul. 15, 2020, the entire contents of which is incorporated herein for all purposes by this reference.

BACKGROUND OF THE INVENTION

1. Field of the Invention

The present invention relates to a method of and an apparatus for generating a skyrmion. More particularly, the present invention relates to a technique of generating a stabilized skyrmion lattice with a homochiral Neel domain wall in a magnetic multilayer system at a high temperature.

2. Description of the Related Art

Skyrmions are suitably used for a high-density and low-power spin memory device due to its nanometer sizes and efficient current-driven operations thereof. In particular, skyrmions in a magnetic multilayer system having a Neel domain wall perform a current-induced translational motion in a direction parallel or antiparallel to the electric current. This motion is caused by current-driven spin-orbit torque (SOT) acting on the Neel domain wall of the magnetic multilayer system. The SOT applies the same direction of force to the homochiral Neel domain wall, thereby causing the skyrmions to move in parallel or in antiparallel to the direction of electric current according to the chirality of the system. Also, the motion of the skyrmion is a current-driven behavior that occurs in orders of nanoseconds. Owing to the efficient current-induced motion and ultrafast dynamics, it is expected that a skyrmion of a magnetic multilayer system will be widely used in spin memory devices and spin logic devices.

However, a skyrmion of a magnetic multilayer system is observed only in a temperature range from a cryogenic temperature to the room temperature, and it is known that a stabilized skyrmion is not generated at high temperatures.

FIGS. 1A and 1B are views illustrating a spin structure according to the related art.

FIG. 1A illustrates a spin structure at 298 K, and FIG. 1B illustrates a spin structure at 348 K.

FIG. 1A illustrates a skyrmion lattice spin structure, and FIG. 1B illustrates a stripe spin structure.

The skyrmion lattice spin structure represents a state in which skyrmions are generated and stabilized, and the stripe spin structure represents a state in which the skyrmions have disappeared. In other words, it can be seen from FIG. 1 that skyrmions exist at room temperature but disappear at a temperature of 70° C.

SUMMARY OF THE INVENTION

The present invention has been made in view of the problems occurring in the related art, and an objective of the present invention is to provide a method of and an apparatus for generating a stabilized skyrmion in a magnetic multilayer system at a high temperature.

One aspect of the present invention provides a method of a generating a skyrmion in a magnetic multilayer system, the method including: preparing a magnetic multilayer system; and generating a skyrmion at a temperature of 400° C. or higher by adjusting a magnetic anisotropy value and a magnetization value of the magnetic multilayer system.

The magnetic anisotropy value may be in a range of 0 to $2.5 \times 10^4$ J/m$^3$, and the magnetization value may be in a range of $2.0 \times 10^5$ to $5.0 \times 10^5$ A/m.

The generating of a skyrmion may further include adjusting a Dzyaloshinskii-Moriya interaction (DMI) value.

The DMI value may be in a range of $1.2 \times 10^{-3}$ to $1.8 \times 10^{-3}$ J/m$^2$.

The magnetic multilayer system may include a first lower layer, a first magnetic layer formed on the first lower layer, a first upper layer formed on the first magnetic layer, a second lower layer formed on the first upper layer, a second magnetic layer formed on the second lower layer, and a second upper layer formed on the second magnetic layer. The first magnetic layer and the second magnetic layer may be formed of different materials.

Each of the first magnetic layer and the second magnetic layer may be formed of any one material selected from the group consisting of $Co_xFe_{1-x}$ (where x is 0 to 1) and $Co_yFe_{1-y-z}B_z$ (where z is 0 to 0.2 and y is 0 to 1−z).

The first lower layer may be formed of the same material as the second lower layer, the first upper layer may be formed of the same material as the second upper layer, the material of the first and second lower layers may be different from the material of the first and second upper layers, and each of the first lower layer, the second lower layer, the first upper layer, and the second upper layer may be formed of any one material selected from the group consisting of Ta, W, Re, Os, Ir, Pt, and Ru or may be formed of an alloy of two or more materials selected from the same group.

Another aspect of the present invention provides an apparatus for generating a skyrmion, the apparatus including: a magnetic multilayer system; and a skyrmion generation unit configured to generate a skyrmion at a temperature of 400° C. or higher by adjusting a magnetic anisotropy value and a magnetization value of the magnetic multilayer system.

With the use of the present invention, a skyrmion can be generated and stabilized in a magnetic multilayer system at a high temperature.

DESCRIPTION OF THE PREFERRED EMBODIMENTS

Hereinbelow, exemplary embodiments of the present invention will be described in detail with reference to the accompanying drawings.

Figure 1A:
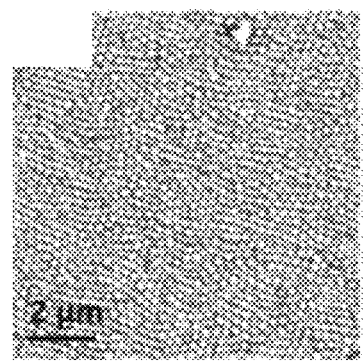
FIGS. 1A and 1B are views illustrating a spin structure according to the related art.
Figure 1B:
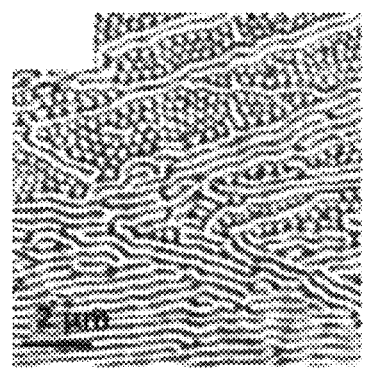
Figure 2:
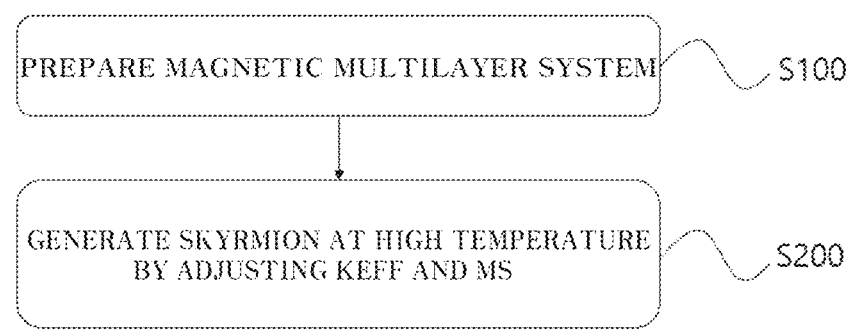
FIG. 2 is a diagram illustrating a method of generating a skyrmion, according to an embodiment of the present invention.

FIG. 2 is a diagram illustrating a method of generating a skyrmion, according to one embodiment of the present invention.

Referring to FIG. 2, the skyrmion generation method includes: preparing a magnetic multilayer system at step S100; and generating a skyrmion at a temperature of 400° C. or higher by adjusting the magnetic anisotropy value $K_{eff}$ and the magnetization value $M_s$ of the magnetic multilayer system at step S200.

Figure 3:
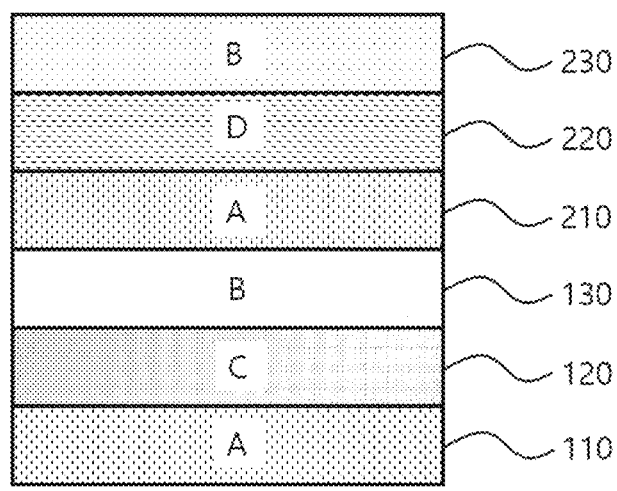
FIG. 3 is a diagram illustrating a unit structure of a magnetic multilayer system to which the skyrmion generation method according to the present invention is applied.

FIG. 3 is a diagram illustrating a basic structural unit 1 of a magnetic multilayer system to which the skyrmion generation method according to the present invention is applied. Although FIG. 3 illustrates only one basic structural unit constituting a magnetic multilayer system, the magnetic multilayer system may be composed of more than one basic structural unit 1 stacked on each other. For example, five basic structural units 1 may be stacked in a vertical direction.

Referring to FIG. 3, the basic structural unit 1 includes a first lower layer 110, a first magnetic layer 120 formed on the first lower layer 110, a first upper layer 130 formed on the first magnetic layer 120, a second lower layer 210 formed on the first upper layer 130, a second magnetic layer 220 formed on the second lower layer 210, and a second upper layer 230 formed on the second magnetic layer 220. The first magnetic layer 120 and the second magnetic layer 220 are formed of different materials.

Each of the first magnetic layer 120 and the second magnetic layer 220 is formed of any one material selected from the group consisting of $Co_xFe_{1-x}$ (where x is 0 to 1) and $Co_yFe_{1-y-z}B_z$ (where z is 0 to 0.2 and y is 0 to 1−z). For example, each of the first magnetic layer 120 and the second magnetic layer 220 is made of Co (where x is 1), Fe (where x is 0), or $Co_xFe_{1-x}$ (where z is 0).

The first magnetic layer 120 and the second magnetic layer 220 are formed of different materials. The term "different materials" means not only a case where one material and another material differ in constituent elements thereof as in a case of Co and CoFe but also a case where one material and another material are the same in constituent elements thereof but differ in the composition ratios of the constituent elements as in a case of $Co_{0.5}Fe_{0.3}B_{0.2}$ and $Co_{0.1}Fe_{0.7}B_{0.2}$.

The first lower layer 110 is formed of the same material as the second lower layer 210, and the first upper layer 130 is formed of the same material as the second upper layer 230. In this case, the material of the first 110 and second lower layers 210 differs from the material of the first 130 and second upper layers 230.

That is, as illustrated in FIG. 3, the first lower layer 110 and the second lower layer 210 are formed of a material A, the first upper layer 130 and second upper layer 230 are formed of a material B different from material A, the first magnetic layer 120 is formed of a magnetic material C, and the second magnetic layer 220 is formed of a magnetic material D different from the magnetic material C.

Each of the first lower layer 110, the second lower layer 210, the first upper layer 130, and the second upper layer 230 is formed of any one metal selected from the group consisting of Ta, W, Re, Os, Ir, Pt, and Ru or is formed of an alloy of two or more materials selected from the same group.

Next, test and simulation results which are the basis leading to the present invention will be described.

FIGS. 4A, 4B, 4C and 4D are graphs illustrating a change in a magnetic characteristic with the temperature of a magnetic multilayer system. For the test, a magnetic multilayer system was prepared by stacking ten basic structural units, each basic structural unit being a laminate of Ru(0.85)/Pt (0.6)/Co (1.3)/Ru(0.85)/Pt (0.6)/Co₄Fe₄B₂(0.8). The numbers in the parentheses represent thicknesses in nanometers.

Figure 4A:
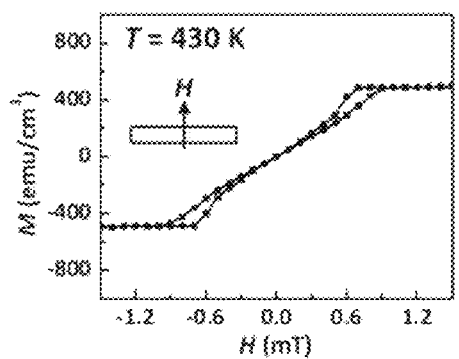
FIGS. 4A, 4B, 4C and 4D are graphs illustrating a change in a magnetic characteristic with the temperature of a magnetic multilayer system.
Figure 4B:
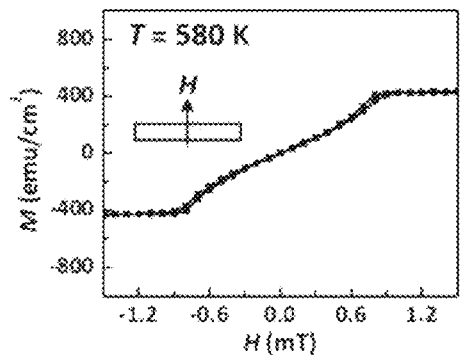
Figure 4C:
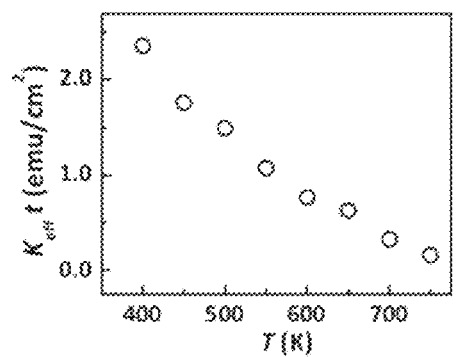

FIGS. 4A and 4B are out-of-plane magnetic hysteresis curves measured at 430 K and 580 K, respectively. FIG. 4C shows effective magnetic anisotropy values $K_{eff}$ at different temperatures, and FIG. 4D shows saturation magnetization values $M_s$ at different temperatures.

The basic structural unit "Pt/Co/Ru" and the basic structural unit "Pt/CoFeB/Ru" have an out-of-plane magnetic easy axis but the basic structural unit "Ru/Pt/Co/Ru/Pt/CoFeB" has almost no residual magnetization. It was confirmed through Lorentz transmission electron microscopy (LTEM) that the phenomena were due to the formation of an out-of-plane stripe domain with a 50:50 (up:down) magnetization area. Here, the 0.6 nm-thick Pt layer adjacent to the CoFeB layer and the 0.6 nm-thick Pt layer adjacent to the Co layer were completely magnetized due to a magnetic proximity effect. The 0.85 nm-thick Ru layer causes antiferromagnetic interlayer coupling between layers adjacent to each other at a room temperature. However, at a temperature of 400 K or higher, the Ru interlayer coupling changes to ferromagnetic interlayer coupling due to an annealing effect, so that the basic structural unit "Ru/Pt/Co/Ru/Pt/CoFeB" acts like a single magnetic layer.

Figure 4D:
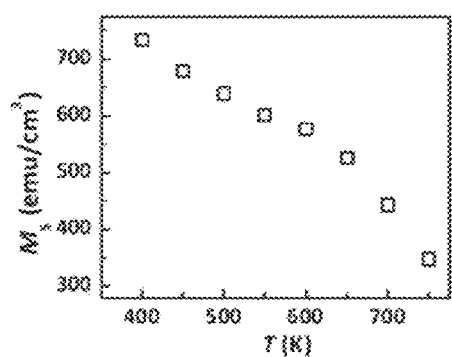

As illustrated in FIGS. 4C and 4D, when the temperature was changed from 400 K to 750 K, the saturation magnetization value $M_s$ and the effective magnetic anisotropy value $K_{eff}$ decreased significantly. That is, a decrease in a material parameter has an impact on the phase of a magnetic domain. The fact was confirmed from LTEM images and simulation results to be described below.

Figure 5A:
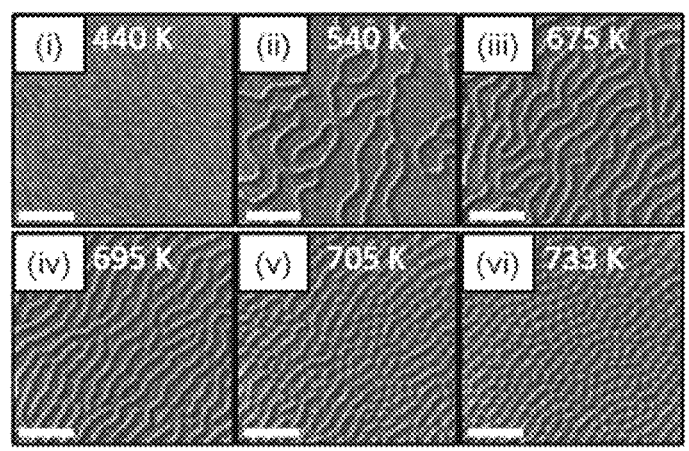
FIGS. 5A and 5B are Lorentz transmission electron microscopy (LTEM) images illustrating a magnetic domain at different temperatures.
Figure 5B:
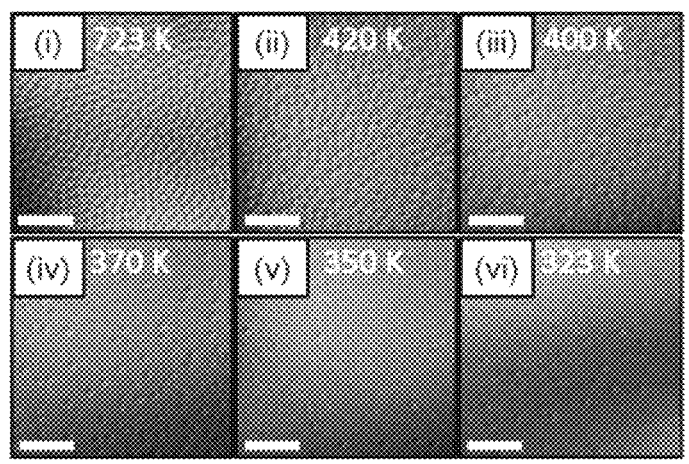

FIGS. 5A and 5B are Lorentz transmission electron microscopy (LTEM) images illustrating a magnetic domain at different temperatures.

As a sample, a magnetic multilayer system having a laminate of Ru/Pt/Co/Ru/Pt/CoFeB as a basic structural unit was used. FIG. 5A illustrates a phase change of a magnetic domain which occurs when the temperature of the magnetic multilayer system is increased, and FIG. 5B illustrates a phase change of a magnetic domain which occurs when the temperature is decreased.

In the LTEM measurement, the contrast (shading) of a magnetic domain wall was observed with the sample tilted by an angle of 30°. In the LTEM measurement, the contrast of a Neel domain wall was completely canceled when the sample was not tilted. This means that the magnetic domain wall is a chiral Neel domain wall. This magnetic domain wall of the magnetic multilayer system is expected to be a chiral Neel domain wall due to a Dzyaloshinskii-Moriya interaction (DMI) at the Pt/Co interface and the Pt/CoFeB interface that induce left-handed chirality.

FIG. 5A illustrates a change in a magnetic domain during a temperature increase from room temperature to 733 K at a constant out-of-plane magnetic field of 29 mT. In the sample, an out-of-plane single domain (see (i) of FIG. 5A) was maintained until the temperature reached 530 K, and two phase transitions were observed at temperatures higher than 530 K. First, at a temperature of 540 K, the phase was transitioned from a single domain to a stripe domain (see (ii) of FIG. 5A). As described above, the stripe domain has Neel domain walls with the same chirality. When the temperature was further increased, another phase transition from a chiral stripe domain to a skyrmion lattice occurred at a temperature of 733 K (see (vi) of FIG. 5A).

When the temperature was lowered back to the room temperature from 723 K (see (i) of FIG. 5B) at which the skyrmion lattice appears, the density of skyrmions begins to decrease at about 420 K (see (ii) of FIG. 5B), and the magnetization in an out-of-plane direction was gradually saturated as the temperature was lowered from 420 K (see (iii) to (vi) of FIG. 5B). The stripe domain did not appear during the temperature decrease. This means that the phase change in the magnetic domain indicates a temperature-dependent hysteresis.

The size of the skyrmion in the FIG. 5A is about 155 nm, and the distance between the skyrmion vi of FIG. 5A and the skyrmion i of FIG. 5B is about 195 nm. This means that the skyrmions account for about 43% to 56%. From these observations, it can be seen that the high-density skyrmion arrays (see (vi) of FIG. 5A and (i) of FIG. 5B) are similar to a homochiral skyrmion lattice.

The results of the test show that in a magnetic multilayer system, a homochiral magnetic skyrmion lattice with a high density can be stabilized at a high temperature, for example, 700 K or higher.

Figure 6A:
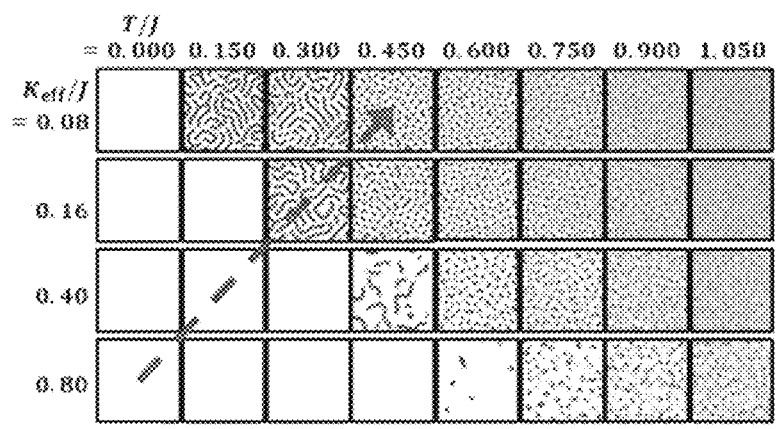
FIGS. 6A and 6B are views illustrating Monte-Carlo simulation results showing a phase change of a magnetic domain depending on a temperature.
Figure 6B:
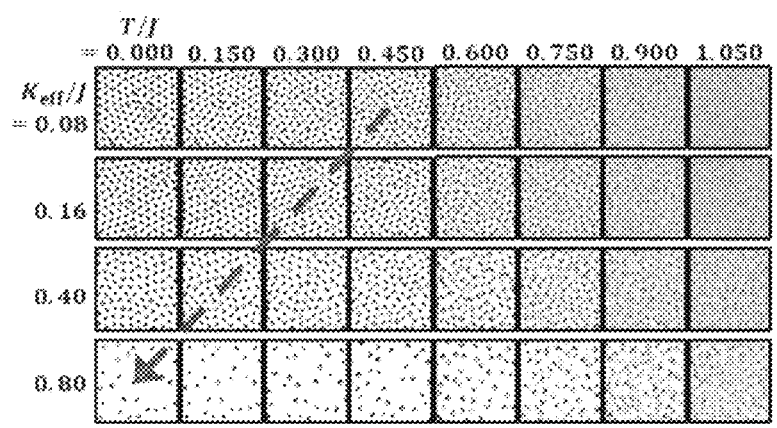

FIGS. 6A and 6B are views illustrating Monte-Carlo simulation results showing a phase change of a magnetic domain depending on a temperature.

As described above, due to the ferromagnetic interlayer coupling between the Co layer and the CoFeB layer, the entire multilayered thin film acts like a single magnetic layer. Therefore, a single two-dimensional layer was assumed in the simulation.

A Monte-Carlo simulation was performed using Equation 1 and Equation 2.

$$H = -J \sum_{<i,j>} \vec{S}_i \cdot \vec{S}_j - \sum_{<i,j>} \vec{DM}_{ij} \cdot (\vec{S}_i \times \vec{S}_j) -$$ [Equation 1]

-continued
$$K_{\it eff} \sum_i |\vec{S}_{i,z}|^2 + D_{dip} \sum_{i,j} \frac{\vec{S}_i \cdot \vec{S}_j}{|\vec{r}_{ij}|^3} - \vec{h}_{ext} \cdot \sum_i \vec{S}_i$$

where J, $\vec{DM}_{ij}$, $K_{\it eff}(=K_s-2\pi M_s^2)$, $D_{dip}$, and $\vec{h}_{ext}$ denote, respectively, an exchange interaction, a DMI at a lattice position (i,j), an effective vertical magnetic anisotropy, a magnetic dipole interaction, and an external magnetic field.

For convenience of calculation, the spin vector S at a lattice position is set to the unit vector, and r in the dipole interaction is set to a dimensionless displacement vector. Therefore, J, $\vec{DM}_{ij}$, $K_{\it eff}(=K_s-2\pi M_s^2)$, $D_{dip}$, and $\vec{h}_{ext}$ is expressed in unit of energy.

The spin configuration obtained from the simulation using a relationship among a random number R, a temperature parameter T, a spin vector S, and an effective field $$\left( \vec{h}_{\it eff} = \frac{1}{\mu_0} \frac{\partial H}{\partial \vec{S}_i} \right)$$

is expressed by Equation 2.

$$|\vec{S}_{//\vec{h}_{\it eff}}| = \frac{T \log[\exp(-|\vec{h}_{\it eff}|/T) + 2R \times \sinh(|\vec{h}_{\it eff}|/T)]}{|\vec{h}_{\it eff}|}$$ [Equation 2]

$$|\vec{S}_{\perp \vec{h}_{\it eff}}| = \sqrt{1 - |\vec{S}_{//\vec{h}_{\it eff}}|^2}$$

where $\vec{s}_{//\vec{h}_{\it eff}}$ is a spin component in a direction parallel to $\vec{h}_{\it eff}$, and $\vec{s}_{\perp \vec{h}_{\it eff}}$ is a spin component in a direction perpendicular to $\vec{h}_{\it eff}$.

A magnetic domain was obtained with a fixed DMI, a fixed out-of-plane magnetic field, and some typical $K_{\it eff}$ values during a temperature increase (FIG. 6A) and a temperature decrease (FIG. 6B). In all the cases of the temperature increasing process, the initial state (T=0 K) is an out-of-plane single magnetic domain state due to the presence of an external out-of-plane magnetic field (rightmost image in FIG. 6A). On the other hand, the initial state of the temperature decreasing process is a paramagnetic state (leftmost image in FIG. 6B). Considering the temperature dependency of the magnetic anisotropy value $K_{\it eff}$ illustrated in FIG. 4C, the experimental observation of a phase transition of a single-stripe skyrmion domain according to the temperature increase (FIG. 5A) and decrease (FIG. 5B) was qualitatively reproduced in the simulation along the red dotted arrows in FIGS. 6A and 6B. Moreover, the magnetic domain change process that differently appears during the temperature increase and decrease observed in FIG. 5 is also shown in the simulation results. From the simulation, it can be seen that the temperature-dependent change of the magnetic anisotropy value $K_{\it eff}$ greatly contributes to the existence of the hysteresis of the magnetic domain wall change. In addition, by selecting the magnetic anisotropy value and the magnetization value (magnetic field) appropriately, it can be seen that a dense skyrmion array can be stabilized within a wide temperature range of a magnetic multilayer system.

The simulation results were obtained continuously from right to left direction by the temperature decrease process. An initial state is a paramagnetic state, and the temperature slowly decreases. Thus, a magnetic domain that minimizes energy and entropy was created. Therefore, FIG. 6B may be similar to the most stable state (ground state) magnetic domain structure.

FIGS. 7A to 7E are views illustrating results of tests and simulations to observe a phase change of a magnetic domain depending on a magnetic field.

Figure 7A:
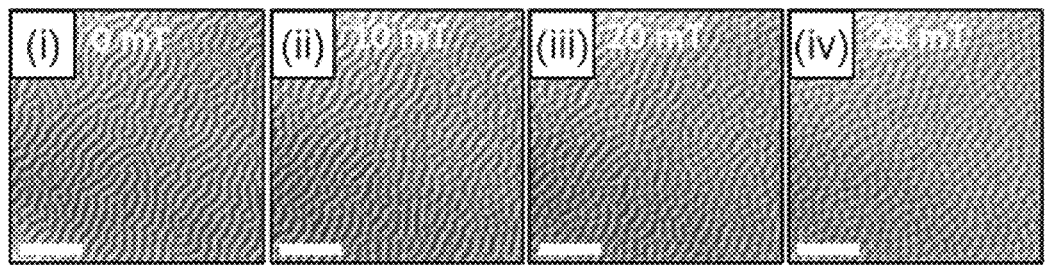
FIGS. 7A, 7B, 7C, 7D and 7E are views illustrating test and simulation results showing a phase change of a magnetic domain depending on a magnetic field.
Figure 7B:
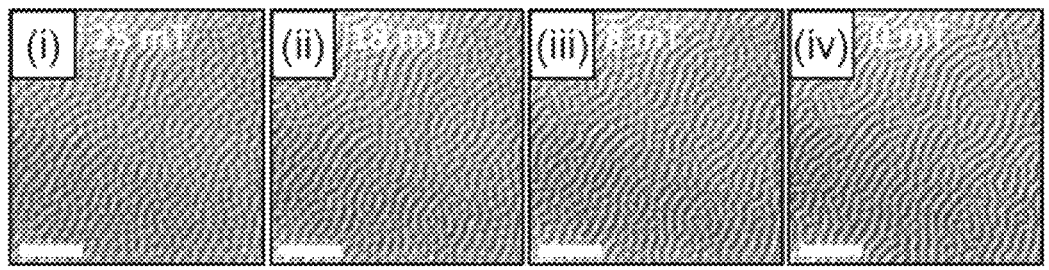
Figure 7C:
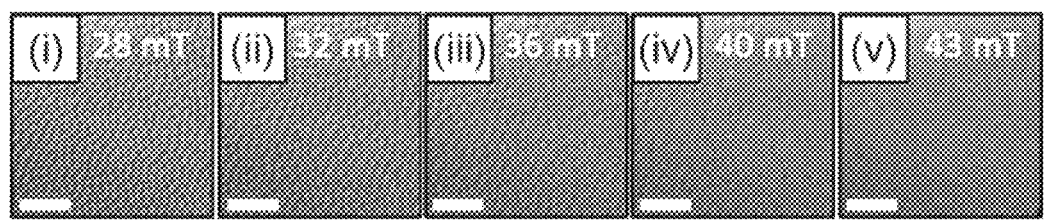

In FIGS. 7A and 7C, a magnetic domain structure was observed while changing an external magnetic field at a fixed sample temperature of 713 K. A white bar indicates 1 μm. A phase transition from a stripe to skyrmion was observed in a process of increasing the out-of-plane magnetic field from 0 to 28 mT (FIG. 7A), and the opposite phase transition was observed in the process of decreasing the out-of-plane magnetic field back to 0 mT (FIG. 7B). At a higher out-of-plane magnetic field, a free energy of the skyrmion lattice is lower than the free energy of the stripe domain due to a destruction of a magnetic field drive out-of-plane symmetry, leading to a completely reversible magnetic field-driven stripe-skyrmion phase transition. As the magnetic field increases to 43 mT, the skyrmion lattice is completely saturated to an out-of-plane single domain (FIG. 7C).

Figure 7D:
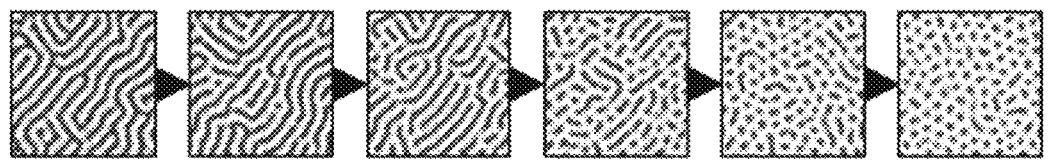
Figure 7E:
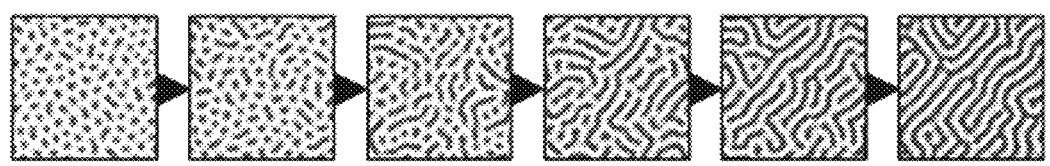

The stripe-skyrmion phase transition process due to the external magnetic field can be confirmed by micro-magnetic simulation (FIGS. 7D and 7E). FIGS. 7D and 7E show Monte-Carlo simulation results, and T/J=0.45 and $K_{eff}$/J=0.08 corresponding to the initial state of the skyrmion lattice of FIGS. 6A and 6B were selected.

From the above, it can be seen that the magnetic field-driven stripe-skyrmion phase transition is completely reversible.

Figure 8A:
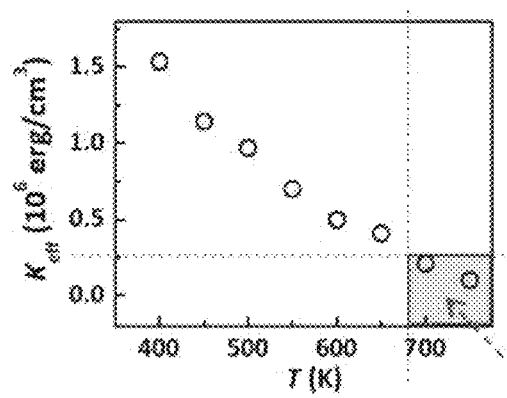
FIGS. 8A and 8B are diagrams showing parameters in a condition in which a skyrmion is generated, the parameters being obtained from the test and simulation results.
Figure 8B:
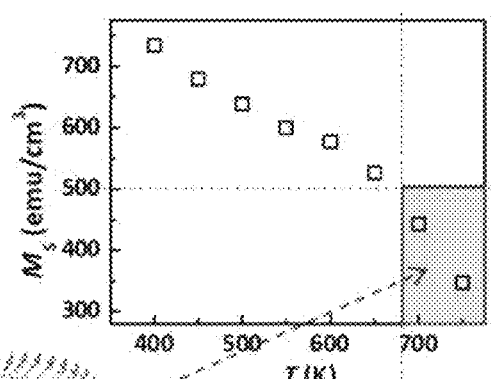

FIGS. 8A and 8B are diagrams showing parameters in a condition in which a skyrmion is generated, the parameters being obtained from the test and simulation results.

Referring to FIG. 8, it can be seen that when a magnetic anisotropy value is in a range of 0 to $2.5 \times 10^4$ J/m$^3$ (i.e. 0 to $0.25 \times 10^6$ erg/cm$^3$), and when a magnetization value is in a range of $2.0 \times 10^5$ to $5.0 \times 10^5$ A/m (i.e. 200 emu/cm$^3$ to 500 emu/cm$^3$), a skyrmion is reliably generated.

In this case, although not illustrated in FIG. 8, it is preferable that the DMI is in a range of $1.2 \times 10^{-3}$ to $1.8 \times 10^{-3}$ J/m$^2$.

It was confirmed that a skyrmion was reliably generated when the parameters were in the ranges described above at a temperature of 400° C. or higher, preferably at temperatures within a range of 150° C. to 460° C.

Figure 9:
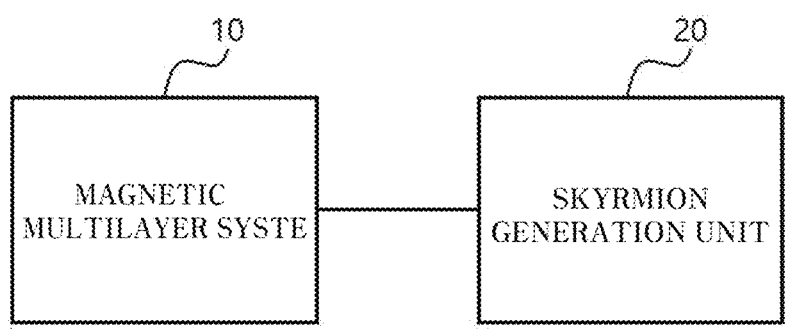
FIG. 9 is a diagram illustrating a configuration of a skyrmion generation apparatus according to one embodiment of the present invention.

FIG. 9 is a diagram illustrating a configuration of a skyrmion generation apparatus according to an embodiment of the present invention.

Referring to FIG. 9, the apparatus includes a magnetic multilayer system 10 and a skyrmion generation unit 20 configured to generate a skyrmion at a temperature of 400° C. or higher by adjusting the magnetic anisotropy value $K_{eff}$ and the magnetization value $M_s$ of the magnetic multilayer system 10.

The magnetic multilayer system 10 corresponds to the magnetic multilayer system illustrated in FIG. 3.

The skyrmion generation unit 20 adjusts the magnetic anisotropy value $K_{eff}$ and the magnetization value $M_s$ in order to generate a stabilized skyrmion lattice at a high temperature, and performs Step S200 shown in FIG. 2. The skyrmion generation unit 20 adjusts the DMI value. The ranges of the magnetic anisotropy value $K_{eff}$, the magnetization value $M_s$, and the DMI value adjusted by the skyrmion generation unit 20 are the same as those described above. Therefore, a redundant description of the ranges will be omitted here. The skyrmion generation unit 20 includes a magnetic field generation device for generating a magnetic field with respect to the magnetic multilayer system 10, a heater/cooler for adjusting the temperature of the magnetic multilayer system 10, and a controller for controlling the magnetic field generation device and the heater/cooler.

Although the exemplary embodiments of the present invention have been disclosed for illustrative purposes, the present invention is not limited thereto, and those skilled in the art will appreciate that various modifications, additions, and substitutions are possible, without departing from the scope and spirit of the invention as defined in the appended claims. Therefore, the protection scope of the present invention should be construed on the basis of the claims, and all equivalents to the technical ideas within the scope also fall within the scope of the invention.

What is claimed is:

1. A method of generating a skyrmion in a magnetic multilayer system, the method comprising:
   preparing a magnetic multilayer system; and
   generating a skyrmion at a temperature of greater than 400° C. by adjusting a magnetic anisotropy value and a magnetization value of the magnetic multilayer system.

2. The method according to claim 1, wherein the magnetic anisotropy value is in a range of 0 to $2.5 \times 10^4$ J/m$^3$, and the magnetization value is in a range of $2.0 \times 10^5$ to $5.0 \times 10^5$ A/m.

3. The method according to claim 1, wherein the generating of a skyrmion further comprises adjusting a Dzyaloshinskii-Moriya interaction (DMI) value.

4. The method according to claim 3, wherein the DMI value is in a range of $1.2 \times 10^{-3}$ to $1.8 \times 10^{-3}$ J/m$^2$.

5. The method according to claim 1, wherein the magnetic multilayer system comprises a first lower layer, a first magnetic layer formed on the first lower layer, a first upper layer formed on the first magnetic layer, a second lower layer formed on the first upper layer, a second magnetic layer formed on the second lower layer, and a second upper layer formed on the second magnetic layer, and
   the first magnetic layer and the second magnetic layer are respectively formed of different materials.

6. The method according to claim 5, wherein each of the first magnetic layer and the second magnetic layer is formed of any one material selected from the group consisting of $Co_xFe_{1-x}$ (where x is 0 to 1) and $Co_yFe_{1-y-z}B_z$ (where z is 0 to 0.2 and y is 0 to 1-z).

7. The method according to claim 5, wherein the first lower layer is formed of the same material as the second lower layer,
   the first upper layer is formed of the same material as the second upper layer,
   the material of the first and second lower layers is different from the material of the first and second upper layers, and
   each of the first lower layer, the second lower layer, the first upper layer, and the second upper layer is formed of any one material selected from the group consisting of Ta, W, Re, Os, Ir, Pt, and Ru or is formed of an alloy of two or more materials selected from the same group.

8. An apparatus for generating a skyrmion, the apparatus comprising:
   a magnetic multilayer system; and
   a skyrmion generation unit configured to generate a skyrmion at a temperature of greater than 400° C. by adjusting a magnetic anisotropy value and a magnetization value of the magnetic multilayer system.

9. The apparatus according to claim 8, wherein the skyrmion generation unit adjusts the magnetic anisotropy value to fall within a range of 0 to $2.5 \times 10^4$ J/m$^3$, and adjusts the magnetization value to fall within a range of $2.0 \times 10^5$ to $5.0 \times 10^5$ A/m.

10. The apparatus according to claim 8, wherein the skyrmion generation unit adjusts a Dzyaloshinskii-Moriya interaction (DMI) value.

11. The apparatus according to claim 10, wherein the skyrmion generation unit adjusts the DMI value to fall within a range of $1.2 \times 10^{-3}$ to $1.8 \times 10^{-3}$ J/m$^2$.

12. The apparatus according to claim 8, wherein the magnetic multilayer system comprises a first lower layer, a first magnetic layer formed on the first lower layer, a first upper layer formed on the first magnetic layer, a second lower layer formed on the first upper layer, a second magnetic layer formed on the second lower layer, and a second upper layer formed on the second magnetic layer, and the first magnetic layer and the second magnetic layer are respectively formed of different materials.

13. The apparatus according to claim 12, wherein each of the first and second magnetic layers is formed of any one material selected from the group consisting of $Co_xFe_{1-x}$ (where x is 0 to 1) and $Co_yFe_{1-y-z}B_z$ (where z is 0 to 0.2 and y is 0 to 1z).

14. The apparatus according to claim 12, wherein the first lower layer is formed of the same material as the second lower layer, the first upper layer is formed of the same material as the second upper layer, the material of the first and second lower layers is different from the material of the first and second upper layers, and each of the first lower layer, the second lower layer, the first upper layer, and the second upper layer is formed of any one material selected from the group consisting of Ta, W, Re, Os, Ir, Pt, and Ru or is formed of an alloy of two or more materials selected from the same group.

* * * * *